United States Patent [19]

Katzenstein

[11] Patent Number: 4,857,929
[45] Date of Patent: Aug. 15, 1989

[54] APPARATUS FOR CONVERTING DATA BETWEEN ANALOG AND DIGITAL VALUES

[75] Inventor: Henry S. Katzenstein, Pacific Palisades, Calif.

[73] Assignee: Brooktree Corporation, San Diego, Calif.

[21] Appl. No.: 724,829

[22] Filed: Apr. 19, 1985

Related U.S. Application Data

[63] Continuation of Ser. No. 383,544, Jun. 1, 1982.

[51] Int. Cl.$^4$ ............................................. H03M 1/76
[52] U.S. Cl. .................................... 341/148; 341/145
[58] Field of Search ................ 340/347 AD; 341/136, 341/144, 145, 148, 154

[56] References Cited

U.S. PATENT DOCUMENTS

4,393,370 7/1983 Hareyama .................... 340/347 DA

Primary Examiner—William M. Shoop, Jr.
Assistant Examiner—Marc J. Hoff
Attorney, Agent, or Firm—Ellsworth R. Roston; Charles H. Schwartz

[57] ABSTRACT

Sub-sets of switches are provided each having a number of switches directly related to an individual bit in a binary coded input word. Signals representing the individual bits are introduced to the switches in the different sub-sets to obtain switch conductivities in accordance with such binary bits. The switches are connected in a repetitive array to provide paths through the conductive ones of the switches. The switches are connected to output members and a line to introduce the current through the output members to the line in accordance with the pattern of switch conductivities. This provides for progressive increases in the number of the output members connected to the line, ad for a continued connection to the line of output members previously connected to the line, with progressive increases in the binary value. The cumulative current through the line is indicative of the analog value. Additional circuitry may provide an indication of the reduced binary values relative to the binary values represented by the switches. An interpolation line may be connected to the repetitive array to receive a current from the output member to be connected next to the line for increasing binary values. The interpolation line and the additional circuitry may be connected to provide a current from such circuitry in accordance with the reduced binary values and to introduce such current to the line to provide an output current on the line in representation of the analog value. The additional circuitry may constitute another repetitive array.

30 Claims, 5 Drawing Sheets

| "1" | "2" | "4" | | | | | | | | I |
|---|---|---|---|---|---|---|---|---|---|---|
| 0 | 0 | 0 | H | D | F | B | G | C | E | H |
| 1 | 0 | 0 | H | D | F | B | G | C | E | D |
| 0 | 1 | 0 | H | D | F | B | G | C | E | F |
| 1 | 1 | 0 | H | D | F | B | G | C | E | B |
| 0 | 0 | 1 | H | D | F | B | G | C | E | G |
| 1 | 0 | 1 | H | D | F | B | G | C | E | C |
| 0 | 1 | 1 | H | D | F | B | G | C | E | E |
| 1 | 1 | 1 | H | D | F | B | G | C | E | A |

REFERENCE CURRENT

APPARATUS FOR CONVERTING DATA BETWEEN ANALOG AND DIGITAL VALUES

This is a continuation, of application Ser. No. 383,544, filed June 1, 1982.

This invention relates to apparatus for converting data between a digital form and an analog form. More particularly, the invention relates to apparatus which provides such conversion instantaneously and on a monotonic basis and in a simple and reliable manner.

Various types of equipment receive information in analog form. Such equipment includes process control equipment, measuring instruments, communication equipment and a wide variety of other equipment. Digital computers and data processing systems often receive input paramaters in analog form from such equipment and convert these parameters to digital form for processing in the computer or the data processing equipment. After the analog information has been converted to digital information and has been processed, the output information from the digital computer or the data processing equipment is often converted to analog form. By converting the digital information to analog form, the user can assimilate the information in ways which would be difficult if the information remained in digital form.

A good example of the conversions discussed in the previous paragraph is in the recording and reproduction of music. The music is produced in analog form. It is converted to digital form by recently developed data processing techniques and is recorded on a medium such as a tape or a disc. When the music is to be reproduced, it is converted again to analog form because this is the form which is necessary to operate sound transducers to give meaning to the listener when he hears the music.

As digital computers and data processing equipment have become widespread throughout industry and the office and have even become common in the home, the need for inexpensive, simple and reliable apparatus for converting information between analog and digital forms has become of increasing concern. A considerable effort has been devoted over a period of several decades to provide for converting apparatus which is simple, inexpensive and reliable. In spite of such efforts, the converting apparatus now in use does not meet such criteria.

The converting apparatus now in use also has other problems of long-standing. For example, the converting apparatus now in use may not be monotonic unless it is quite expensive and complex. By "monotonic" is meant that digital information of progressively increasing value is converted to analog information of progressively increasing value without any decrease in the analog values as the digital value progressively increases. The converting apparatus now in use also has relatively high differential and integral non-linearities unless the apparatus is quite expensive and complex. Integral non-linearities result from errors produced in a conversion between analog and digital values over a wide range of such values. Differential non-linearities result from errors produced in a conversion between analog and digital values over a relatively narrow range of such values.

The converting apparatus now in general use also has a problem of major proportions. This results when particular digital values are increased incrementally by a single digit. For example, problems in the converters now in use result when a binary representation of "511" is converted to a binary representation of "512". This results from the fact that the binary representation of "511" is represented by a value of 0111111111 and a binary representation of "512" is represented by 1000000000 where the least significant digit is at the right. As will be seen, the value of each binary digit changes when the decimal value changes from "511" to "512". As the binary values change from 0111111111 to 1000000000, discontinuties may occur because there is a change between a binary value of "0" and a binary value of "1" at each digital position. These discontinuities may prevent the converter from being truly monotonic. This problem even exists in converters which are made quite complex in an attempt to overcome the problem.

In copending application Ser. No. 302,841 filed by me and Herbert Sullivan on Sept. 16, 1981, for "Apparatus for Providing a Conversion Between Digital and Analog Values" and assigned of record to the assignee of record of this application, apparatus is disclosed and claimed for converting between analog and digital values on a monotonic basis. Such apparatus is simple and inexpensive and reliable. It is able to operate with a high precision at high levels of power. As a result, the converting apparatus is capable of being used in areas not available for the converters of the prior art. For example, such apparatus is able to convert oral information in analog form into information in digital form and to convert the digital information back to the oral information in analog form by serving both as a converter and an amplifier.

The apparatus disclosed and claimed in application Serial No. 302,841 also has other advantages of some importance. For example, it provides analog values of progressively increasing value as the digital value to be converted increases. It provides low differential and integral non-linearities. It is also free of the effects of aging and changes in temperature. It also provides accurate and reliable conversions between analog and digital values at high frequencies with minimal error.

This invention provides a converter which has all of the advantages described above. The converter of this invention also has other advantages of some importance. For example, the converter is able to provide an instantaneous conversion between analog and digital values, and it provide a monotonic operation with minimal integral and differential non-linearities. The converter is also quite simple in construction and is reliable in operation.

In one embodiment of the invention, apparatus is provided for converting between analog and digital values. The apparatus includes means for providing a plurality of signals representing the digital values. Pluralities of control switches are also provided, the number of control switches in each plurality being directly related to the digital significance of the control switches in such plurality. The control switches may be paired to provide for a conductivity of one switch in each pair. The signals representing individual digital values are introduced to the pluralities of control switches of corresponding digital significance to provide for the conductivity of an individual one of the control switches in each pair in accordance with the digital value represented by the signals introduced to the control switches in such pair.

The switches are connected in a repetitive array to provide paths through the conductive ones of the control switches. The switches are connected in a circuit with output members and a line. Since the output members are conductive, the control switches operate to introduce the current through the output members to the line. This provides for progressive increases in the number of the output members connected to the line with progressive increases in the digital value and for a connection to the line of the output members previously connected to the line with progressive increases in the digital value. The cumulative current through the output members connected to the line is indicative of the analog value.

Additional means may be connected to provide an indication of the digital values of reduced digital significance relative to the digital significance of the pluralities of control switches. An interpolation line may be connected to the repetitive array to receive a current from the output member to be connected next to the line for increasing digital values. The interpolation line and the additional means and the means providing the digital values of reduced digital significance may be connected to provide a current from the additional means in accordance with the value of the digits of reduced digital significance and for introducing such current to the line to provide an output current on the line in representation of the analog value. The additional means may constitute another repetitive array.

Figure 1:
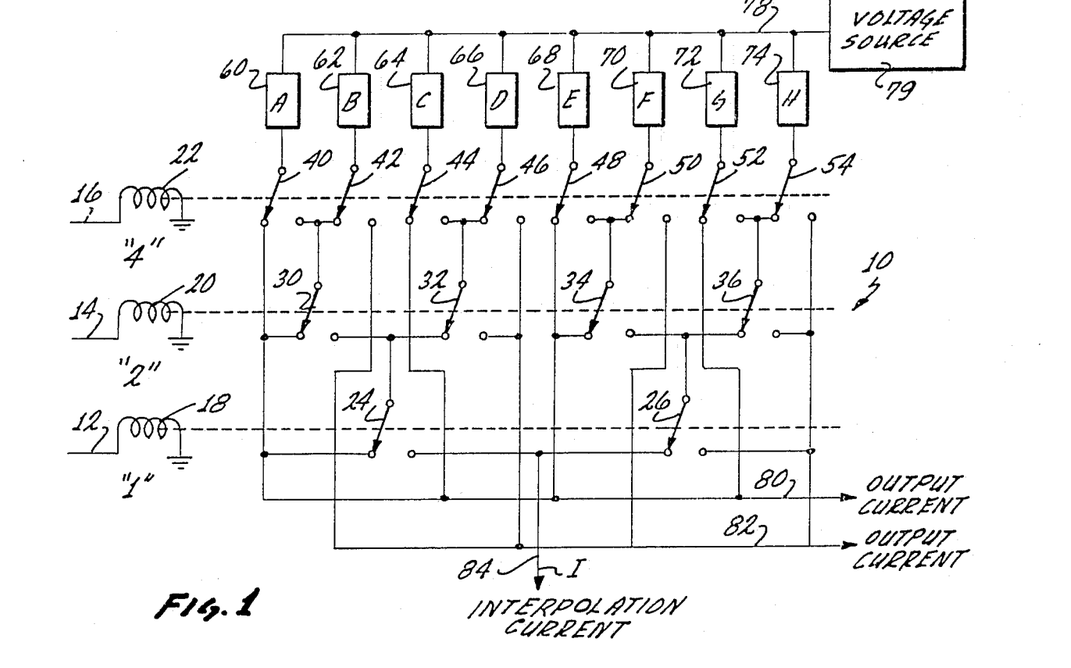
FIG. 1 is a schematic circuit diagram of one embodiment of the invention, this embodiment employing magnetic relays and switches as control elements.

In the embodiment of the invention shown in FIG. 1, a digitial-to-analog converter generally indicated at 10 is provided. The converter 10 receives digital signals on a plurality of input lines 12, 14 and 16. The signals on the lines preferably represent information in binary form. For example, the signals on the line 12 may represent a binary value of "1" and the signal on the lines 14 and 16 may respectively represent binary values of "$2^1$" and "$2^2$". Illustratively, a binary "1" may be represented by a signal of high amplitude and a binary "0" may be represented by a signal of low amplitude. Although only three (3) digits are shown, it will be appreciated that any particular number of digits may be used.

Actuating means such as solenoids may be associated with each of the lines 12, 14 and 16. The solenoids respectively associated with the lines 12, 14 and 16 are designated as 18, 20 and 22. Control switches 24 and 26 are respectively associated with the solenoid 18. Control switches 30, 32, 34 and 36 are respectively associated with the solenoid 20 and control switches 40, 42, 44, 46, 48, 50 and 52 are associated with the solenoid 22. Each of the control switches is provided with a movable arm which is moved from the left stationary contact to the right stationary contact in FIG. 1 when the associated solenoid is energized.

As will be appreciated, the solenoids 18, 20 and 22 and the switches 24 through 54 (even numbers only) may be considered to be representative of different types of arrangements which can be used. The switches may be electromagnetic as shown in FIG. 1 or may constitute any other type of arrangement for providing one state of operation when the digit controlling the operation of the switch has a binary value of "1" and for providing another state of operation when the digit controlling the operation of the switch has a binary value of "0". As will be seen, for example, from the embodiment shown in FIG. 3, the switches may be replaced by pairs of transistors.

A plurality of output members 60, 62, 64, 66, 68, 70, 72 and 74 are also provided in the embodiment of FIG. 1. Each of the output members is constructed to provide an output having the same characteristics as the output provided by the other members. For example, the output members 60 through 74 (even numbers only) may constitute current sources which provide substantially equal currents when energized.

The control switches 24 through 54 (even numbers only) are connected to one another in a repetitive array. This array has a repetitive pattern of switch connections to obtain the operation of the switches in a pattern dependent upon the binary coded input signals on the lines 12, 14 and 16. The movable arms of the control switches 40 through 54 (even numbers only) are respectively connected to the output members 60 through 74 (even numbers only), each of which receives an input voltage on a line 78 from a source 79.

The left stationary contacts of the switches 40, 44, 48 and 52 are connected to an output line 80 and the right stationary contacts of the switches 42, 46, 50 and 54 are connected to an output line 82. Connections are made from the right contact of the switch 40 and the left contact of the switch 42 to the movable arm of the switch 30, from the right contact of the switch 44 and the left contact of the switch 46 to the movable arm of the switch 32, from the right contact of the switch 48 and the left contact of the switch 50 to the movable arm of the switch 34 and from the right contact of the switch 52 and the left contact of the switch 54 to the movable arm of the switch 36.

The left stationary contacts of the switches 30 and 34 are connected to the output line 80, and the right stationary contacts of the switches 32 and 36 are connected to the output line 82. The right stationary contact of the switch 30 and the left stationary contact of the switch 32 are common with the movable arm of the switch 24 and the right stationary contact of the switch 34 and the left stationary contact of the switch 36 are common with the movable arm of the switch 26. The left stationary contact of the switch 24 is connected to the output line 80 and the right stationary contact of the switch 26 is connected to the output line 82. The right stationary contact of the switch 24 and the left stationary contact of the switch 26 are common with an interpolation line 84.

Figure 2:
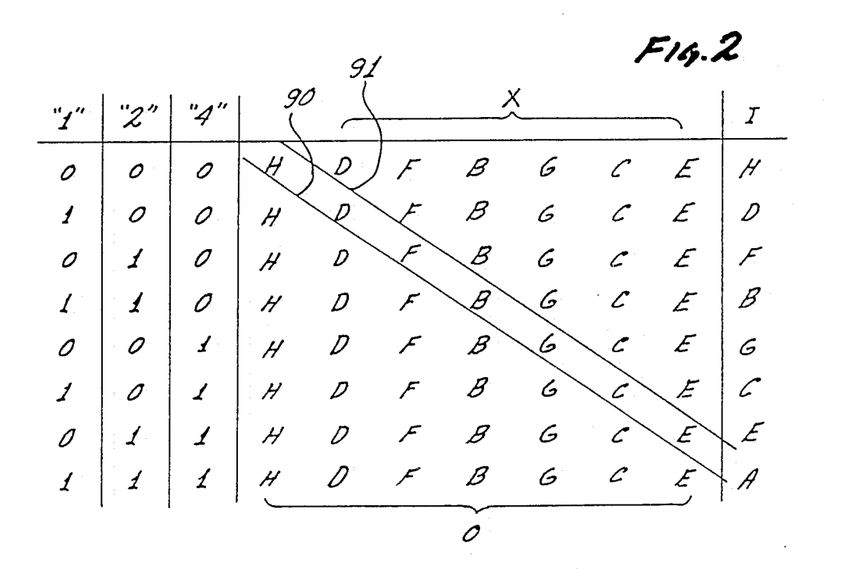
FIG. 2 is a truth table illustrating the operation of the system shown in FIG. 1.

FIG. 2 provides a table indicating the states of operation of the output members 60 through 74 (even numbers only) for different digital values represented by the signals on the lines 12, 14 and 16. As will be seen, the first three columns of FIG. 2 respectively represent the binary values of the signals on the lines 12, 14 and 16. These binary values correspond in successive rows to analog values between "0" and "7". For example, in the third row a value of "010" indicates an analog value of "2" and, in the sixth row, a digital representation of "101" represents an analog value of "5".

The next seven (7) columns represent the states of connection of the output members 60 through 74 (even numbers only). These states of conductivity are represented by the letters "A" through "H" which respectively correspond to the output members 60 through 74 (even numbers only). The letters "A" through "H" are shown in FIG. 1 within the blocks respectively representing the output members 60 through 74 (even numbers only).

Diagonal lines 90 and 91 are shown in FIG. 2. These diagonal lines delineate the conductive ones of the output members connected to the output line 82 for the different values between "0" and "7" and the output members connected to the output line 80 for such values. The indications to the left of the diagonal line 90 represent the output members connected to the output line 82 and the indications to the right of the diagonal line 91 represent the output members connected to the output line 80. The output members between the lines 90 and 91 are connected to the interpolation line 84.

The number of output members to the left of the line 90 for any digital value corresponds to the digital value indicated in the first three columns. For example, for a digital value of "010" corresponding to an analog value of "2", the output members "H" and "D" are connected to the output line 82 so that the output line indicated an analog value of "2". Similarly, for a digital value of "101" corresponding to an analog value of "5", the output members "H", "D", "F", "B" and "G" are connected to the output line 82 so that the line 82 indicates the analog value of "5".

As will be further seen, the output members previously connected to the output line 82 for any digital value continue to remain connected to the output line 82 as the digital value increases. In this way, the output indication of the digital value is monotonic for any value of the count. Furthermore, by maintaining the characteristics of the output members 60 through 74 (even numbers only) substantially constant for the different output members, the circuit shown in FIG. 1 has low differential and integral nonlinearities.

The operation of the circuitry shown in FIG. 1 may be seen by an analysis of specific digital values. For example, for a digital value of "010" corresponding to an analog value of "2", a digital value of "1" is produced on the line 14 to actuate the movable arms of the control switches 30, 32, 34 and 36 from the left stationary contacts to the right stationary contacts of the switches. This causes the output member 74 to be conductive through a circuit including the voltage source 79, the line 78, the output member 74, the movable arm and left stationary contact of the switch 54, the movable arm and right stationary contact of the switch 36 and the output line 82. Similarly, a circuit is established to the output line 82 through the output member 66. This circuit includes the voltage source 79, the output member 66, the movable arm and left stationary contact of the switch 46, the movable arm and right stationary contact of the switch 32 and the line 82.

The movable arms of the switches 24 and 26 and of the switches 40, 42, 44, 46, 48, 50, 52 and 54 are actuated from the left stationary contacts to the right stationary contacts of the switches when the digital value is "101" representing an analog value of "5". When these switches are actuated, the output member 74 is energized through a circuit including the voltage source 79, the output member 74, the switch 54 and the output line 82; the output member 66 is energized through a circuit including the voltage source 79, the output member 66, the switch 46 and the output line; the output member 70 is energized through a circuit including the voltage source 79, the output member 70, the switch 50 and the output line 82; and the output member 62 is energized through a circuit including the voltage source, the output member, the switch 42 and the output line 82. The output member 72 is energized through a circuit including the output member, the switch 52, the switch 36, the switch 26 and the output line 82.

The last column of FIG. 2 indicates the particular one of the output members 60 through 74 (even numbers only) to be connected to the interpolation line 84 for any particular digital value. For example, the F output member is indicated in the last column of FIG. 2 as being the particular output member which is connected to the interpolation line 84. As will be seen, this output member then is connected to the output line 82 when the analog value advances from "2" to "3". For an analog value of "2", the output of the F output member is introduced to the interpolation line 84 through a circuit including the voltage source 79, the F output member 70, the movable arm and left stationary contact of the switch 50, the movable arm and right stationary contact of the switch 34, the movable arm and left stationary contact of the switch 26 and the interpolation line 84. In a sense, the connection of individual ones of the output members 60 through 74 (even numbers only) to the interpolation line 84 at different instants indicates the digital value being converted at such instants. The interpolation line 84 also has other important utilities, as will be seen from a subsequent discussion of the embodiment shown in FIG. 4.

Figure 3:
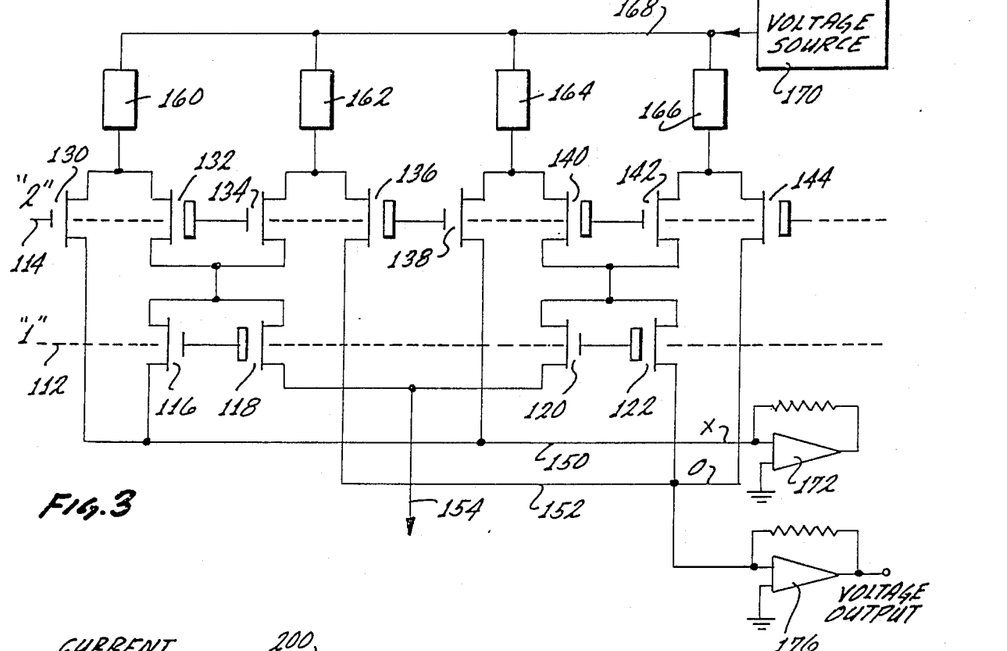
FIG. 3 is a schematic circuit diagram of another embodiment of the invention, this embodiment employing transistors as control elements.

FIG. 3 shows an arrangement substantially similar in concept to that of FIG. 1 except that the control switches of FIG. 1 are replaced by solid state members or elements such as control transistors in FIG. 3. In view of this, FIG. 3 is simplified from FIG. 1 so that only the operation of the circuit for the digital values $2^0=1$ and $2^1=2$ is shown. The digital values $2^0$ and $2^1$ are respectively provided on lines 112 and 114. The line 112 is connected to the bases of transistors 116, 118, 120 and 122. The transistors 116, 118, 120 and 122 may constitute field effect transistors, particularly MOS field effect transistors, or may constitute any other suitable type of control transistor. The transistors 116 and 120 may particularly comprise N-channel field effect transistors and the transistors 118 and 122 may comprise P-channel field effect transistors.

Similarly, the line 114 is connected to the bases of transistors 130, 132, 134, 136, 138, 140, 142 and 144. As with the transistors 116, 118, 120 and 122, the transistors 130 through 144 (even numbers only) may constitute field effect transistors or any other suitable type of transistor. When field effect transistors are used, the transistors 130, 134, 138 and 142 may constitute N-channel field effect transistors and the transistors 132, 136, 140 and 144 may constitute P-channel effect transistors.

The sources of the N-channel transistors 116, 130 and 138 are connected to an output line 150 and the sources of the P-channel transistors 122, 136 and 144 are connected to an output line 152. A connection is made from the source of the P-channel field effect transistor 118 and the N-channel field effect transistor 120 to an interpolation line 154. The drains of the transistors 116 and 118 are common with the sources of the transistors 132 and 134. Similarly, the drains of the transistors 120 and 122 and the sources of the transistors 140 and 142 have a common terminal.

Connections are made from the drains of the transistors 130 and 132 to an output member 160, from the drains of the transistors 134 and 136 to an output member 162, from the drains of the transistors 138 and 140 to an output member 164 and from the drains of the transistors 142 and 144 to an output member 166. The output members are connected through a line 168 to a voltage source 170. The output members 160, 162, 164 and 166 may constitute transistors which provide a large and substantially constant current when conductive. For example, the members 160, 162, 164 and 166 may constitute C-Mos transistors.

The N-channel field effect transistors are non-conductive when a signal having a relatively low voltage and representing a digital value of "0" are introduced to the bases of the transistors. The N-channel field effect transistors such as the transistor 116 become conductive when a positive voltage representing a digital value of "1" is introduced to the bases of the transistors. In contrast, the P-channel field effect transistors such as the transistor 118 are non-conductive when a positive voltage is introduced to the base of the transistor in repesentation of a digital value "1". The P-channel field effect transistors become conductive when a negative voltage representing a digital value of "0" is introduced to the bases of the transistors.

The circuit shown in FIG. 3 and described above operates in a manner similar to the circuit shown in FIG. 1. This may be seen from the fact that each pair of transistors corresponds to one of the switches shown in FIG. 1. For example, a state of conduction in the transistor 116 in FIG. 3 corresponds to the disposition of the movable arm of the switch 24 against the right stationary contact of the switch in FIG. 1. Similarly, a state of conductivity in the transistor 118 in FIG. 3 corresponds to an engagement between the movable arm and the left stationary contact of the switch 24 in FIG. 1.

The operation of the circuit of FIG. 3 may be seen from specific examples. For example, for an analog value of "1" represented by a digital "1" on the line 112 and a digital "0" on the line 114, the transistors 116 and 120 become conductive and the transistors 132, 136, 140 and 144 are conductive. This causes current to flow through a circuit including the voltage source 170, the output member 160, the transistor 132 and the transistor 116 to the output line 150 to indicate an analog value of "1". At the same time, current flows through a circuit including the voltage source 170, the output member 164, the transistor 140, the transistor 120 and the interpolation line 154. The currents through the output members 162 and 166 are introduced to the line 152. Since only the current in the line 150 is effective in indicating the analog value represented by the digital signals, an analog value of "1" is indicated by the current on the line 150.

An amplifier 172 is connected to the line 150 to receive the current through the line and to provide a proper load to the matrix arrangement shown in FIG. 3. The amplifier 172 converts the current in the line 150 to a voltage proportional to this current. Amplifiers corresponding to the amplifier 172 are well known in the art. Similarly, an amplifier 176 is connected to the line 152 to present an appropriate load to the line 152.

The transistors 130, 134, 138 and 142 become conductive and the transistors 118 and 122 become conductive for an analog value of "2". When this occurs, the output member 160 passes a signal to the line 150 through the transistor 130 and the output member 164 passes current to the line 150 through the transistor 138. The transistor 162 passes current to the interpolation line 154 through a circuit including the voltage source 170, the output member 162, the transistor 134, the transistor 118 and the interpolation line. The output member 166 passes current to the output line 152 through a circuit including the transistor 142 and the transistor 122. In this way, the output line 150 receives a current from two of the output members, corresponding to the analog value of "2".

Figure 7:
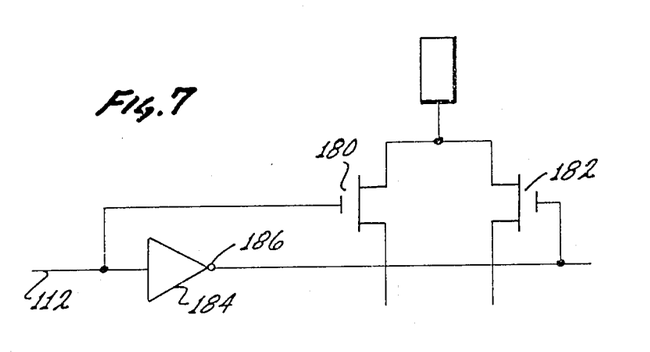
FIG. 7 is a simplified circuit diagram illustrating another transistor arrangement which can be used in the embodiment of FIG. 3.

FIG. 7 indicates an arrangement in which only one particular type of control transistor is used in circuitry corresponding to FIG. 3 rather than the two different types of transistors actually shown in FIG. 3. In the embodiment shown in FIG. 7, each pair of transistors such as the transistors 116 and 118 or the transistors 120 and 122 may be provided by N-channel field effect transistors such as transistors 180 and 182. The base of the transistor 180 is directly connected to an input line such as the line 112. The input line 112 is also connected to the input terminal of an amplifier 184 having its output terminal connected to an inverter 186. A connection is made from the output of the inverter 186 to the base of the transistor 182. The amplifier 184 and the inserter 186 may be an amplifier-inverter and may be disposed in a single package. This is also true of all of the amplifiers and inverters described subsequently.

In the arrangement shown in FIG. 7, the transistor 180 becomes conductive in a manner similar to that described above for the transistor 116 when a signal representing a digital value of "1" is provided on the line 112. At such a time, the transistor 182 remains non-conductive because the digital value of "1" on line 112 is inverted by the amplifier 184 and the inverter 186 to a digital value of "0". When a digital value of "0" is produced on the line 112, the transistor 180 becomes non-conductive in a manner similar to that described above for the transistor 116 in FIG. 3. At the same time, the digital value of "0" is inverted by the amplifier 184 and the inverter 186 so that a signal representing a digital value of "1" is introduced to the base of the transistor 182 to cause the transistor to become conductive.

Figure 4:
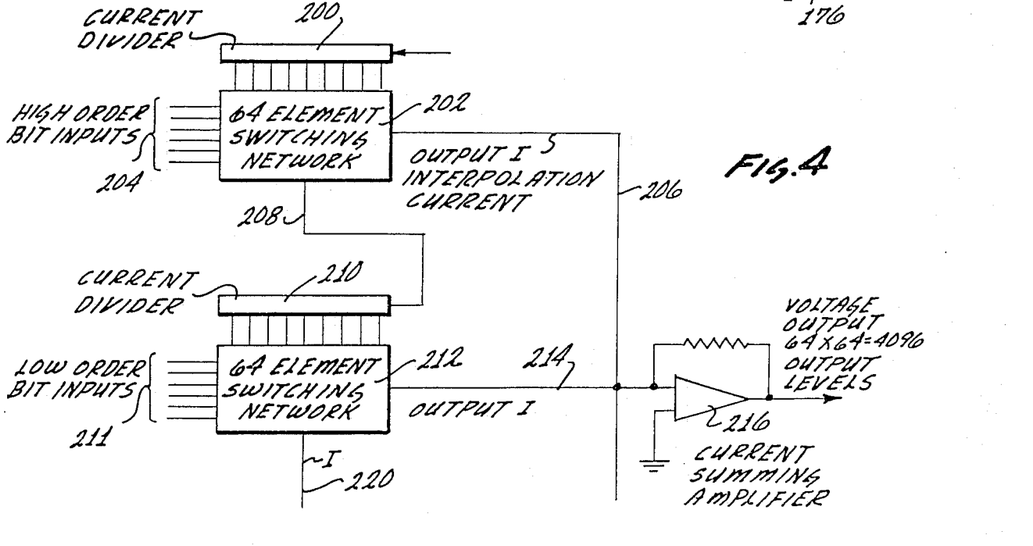
FIG. 4 is a block diagram of another embodiment of the invention, this embodiment illustrating the interconnection of more than one of the embodiments shown in FIG. 3.

FIG. 4 provides an arrangement for converting a considerable number of bits of digital information to a corresponding analog signal in a relatively simple manner. In the embodiment shown in FIG. 4, output members corresponding to the output members 60 through 74 (even numbers only) in FIG. 1 or the output members 160, 162, 164 and 166 in FIG. 3 are illustrated on a block basis at 200. The output members are connected in FIG. 4 to a block 202 corresponding to the repetitive array shown in arrangement shown in FIG. 3. This block may receive signals representing the binary digits of greatest significance. By way of illustration, these signals are introduced to input lines indicated at 204 in FIG. 4. Six (6) input lines are illustrated in FIG. 4. These input lines correspond to the input lines 12, 14 and 16 in FIG. 1 or the lines 112 and 114 in FIG. 34.

An output line 206 extends from the matrix arrangement 202 in FIG. 4. The output line 206 corresponds to the output line 82 in FIG. 1 or the output line 150 in FIG. 3. An interpolation line 208 also extends from the matrix arrangement 202 in FIG. 4. The interpolation line 208 corresponds to the line 84 in FIG. 1 or the line 154 in FIG. 3. The interpolation line 208 in FIG. 4 is connected to a block 210 corresponding to the block 200 in FIG. 4. The block 210 includes a plurality of output members such as is provided for the block 200. The output members are in turn connected to repetitive array 212 corresponding to the repetitive array 202 in FIG. 4. The repetitive array 212 receives signals of decreased digital significance on lines 211 relative to the signals introduced on the lines 204.

An output line 214 extends from the matrix arrangement 212. The output line 214 corresponds to the output line 206 from the repetitive array 202. The output lines 206 and 214 are connected to an amplifier 216 corresponding to the amplifier 172 in FIG. 3. The output voltage from the amplifier 216 indicates the analog value of the digital signals introduced through the lines 204 to the repetitive array 202 and the corresponding digital signals introduced to the repetitive array 212 through the lines 211.

An interpolation line 220 may extend from the repetitive array 212. The interpolation line 220 may correspond to the interpolation line 208 extending from the repetitive array 202. The interpolation line 220 may be connected to an additional block (not shown) corresponding to the blocks 200 and 210. In this way, the chain arrangement shown in FIG. 4 may be extended through any number of successive sequences that the user may desire. As will be appreciated, each extension of the chain increases the accuracy in which the digital information is converted to an analog voltage.

Figure 5:
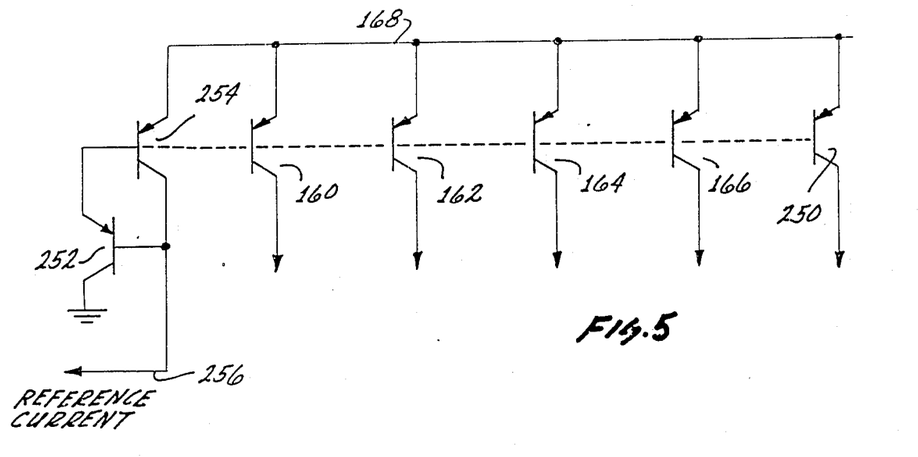
FIG. 5 is a schematic circuit diagram of a current generator capable of being used in the embodiment of FIG. 4.

FIG. 5 illustrates a circuit for insuring that the output members such as the transistors 160, 162, 164 and 166 provide a current of a particular magnitude. The transistors 160, 162, 164 and 166 are shown in FIG. 5 as having their emitters connected to the line 168 in a manner similar to that shown in FIG. 3 and described above. A transistor 250 is also shown as having a similar connection. The transistor 250 may constitute the (n−1)th transistor when there are (n−1) transistors in an arrangement corresponding to the block 202 in FIG. 4. The transistors 160, 162, 164, 166 and 250 are shown in FIG. 4 as constituting pnp transistors.

The bases of the transistors 160, 162, 164, 166 and 250 and the base of a reference transistor 254 in FIG. 5 are connected to the emitter of a transistor 252. The transistors 252 and 254 may also be pnp transistors having characteristics corresponding to the transistors 160, 162, 164 and 166. The base of the transistor 252 is common with the collector of the transistor 254 and with a line 256 providing a reference current. The collector of the transistor 252 may be connected to a reference potential such as ground. Connections are made from the collectors of the transistors 160, 162, 164, 166, 250 and 254 to the matrix arrangement 202 in FIG. 4.

A reference current is drawn from the line 168 through the transistor 254 to the line 256. This causes the base of the transistor 252 to receive a potential for making the transistor conductive. The flow of current through the transistor 252 establishes a potential on the transistor 254 for maintaining the flow of current through the transistor 254.

As the current through the transistor 254 increases, the potential on the collector of the transistor 254 decreases toward the ground potential on the collector of the transistor 252. This causes the current through the transistor 252 to increase and causes the transistor 252 to inject additional current into the base of the transistor 254. This action continues until virtually all of the reference current is conducted by the transistor 254.

The transistors 160, 162, 164, 166 and 250 "mirror" the current through the transistor 254 since they are essentially connected in parallel with the transistor 254. This causes the currents through the transistors 160, 162, 164, 166 and 250 to be substantially equal. In this way, the current on the output line 150 in FIG. 3 provides an accurate analog indication of the digital value being converted, especially when referenced to the current flowing through the transistor 254.

Figure 6:
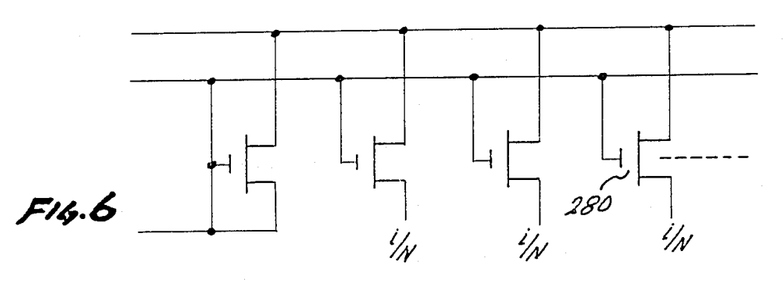
FIG. 6 is a schematic circuit diagram of another current generator capable of being used in the embodiment of FIG. 4.

FIG. 6 illustrates another embodiment of apparatus for providing controlled currents to output members. In this sense, FIG. 6 corresponds to FIG. 5. However, the output members in FIG. 6 are metal-oxide-semiconductor (MOS) field effect transistors. One of these transistors is illustrated at 280 in FIG. 6.

The converters shown in FIGS. 1, 3, 4, 5 and 6 and described above have other advantages in addition to those described above. For example, the repetitive array is constructed to receive directly the digital signals on the input lines such as the lines 12, 14 and 16 and to operate on such signals to provide, on the output line such as the output line 82, a current having an amplitude directly related to the analog value represented by the digital signals. In this way, the converter has a simple and straightforward construction and is still able to provide an accurate analog indication of a digital value.

By providing an arrangement in which all of the output members such as transistors are conductive and switching progressive output members to an output line such as the line 150 in FIG. 3 as the digital value progressively increases, the monotonic operation of the converter shown in FIGS. 1, 3, 4, 5 and 6 is assured. Furthermore, when the output members such as transistors are made with precision and when a considerable number of transistors are responsive to the operation of the matrix arrangements shown in FIGS. 1 and 3, the converters operate to provide minimal differential and integral non-linearities. The monotonic operation of the converter is further assured because all of the output members remain continuously conductive, whether they are connected to either one of the output lines such as the lines 150 and 152 in FIG. 3.

Since the output members such as transistors previously connected to the output line such as the line 150 continue to remain connected to this line and additional output transistors become connected to the output line 150 as the digital value progressively increases, no discontinuities are produced as the number being converted changes from a decimal value such as "511" to a decimal value such as "512" or from a decimal value such as "1023" to a decimal value such as "1024". This further assures that the converters of FIGS. 1, 3, 4, 5 and 6 are monotonic.

Figures 8, 10:
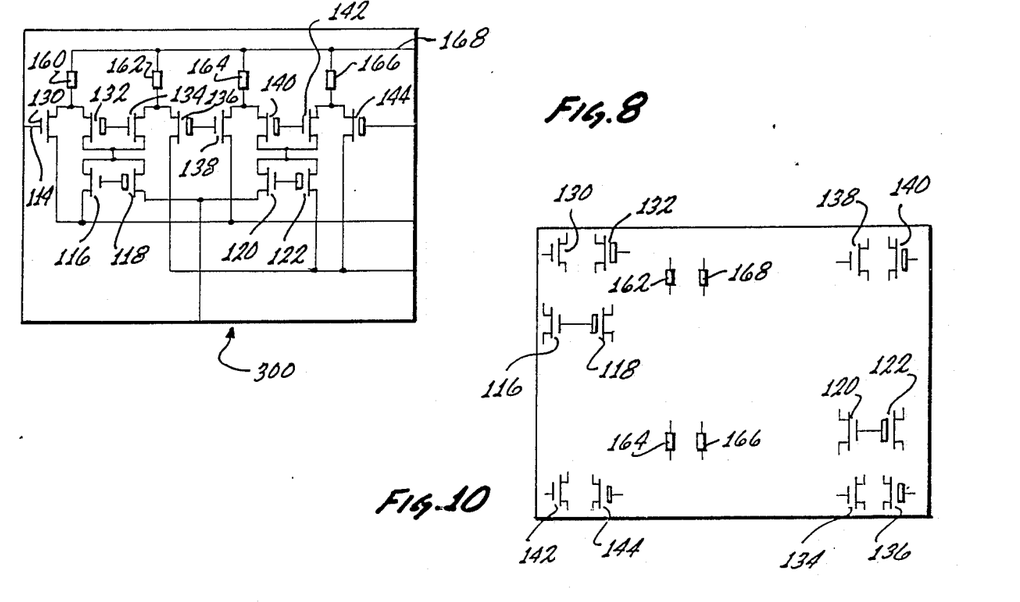
FIG. 8 is a schematic diagram of an integrated circuit chip on which the converter shown in FIG. 3 may be disposed.
FIG. 10 is a schematic diagram showing the spaced disposition on an integrated circuit chip of different transistors shown in FIG. 3.

The converters shown in FIGS. 1, 3, 4, 5 and 6 and described above may be incorporated on an integrated circuit chip generally indicated at 300 in FIG. 8. This is particularly true in view of the simple and straightforward construction of the particular matrix arrangement such as the matrix arrangement 202 in FIG. 4. However, the amplifier arrangement, such as the amplifiers 172 and 176 in FIG. 2, probably will not be incorporated as part of the integrated circuitry on the chip.

Such incorporation of the converter on the chip may be provided by large-scale integration (LSI) or very large scale integration (VLSI) techniques. In this way, the apparatus may be self-contained. Furthermore, since all of the transistors are formed simultaneously and the chip is quite small, the transistors have substantially identical characteristics. This is particularly true since the chip has a surface area less than approximately one tenth inch (1/10") square. The simultaneous formation of the output devices on such a small chip tends to assure that the current on the output line, such as the output line 82 in FIG. 1, indicates accurately in analog form the digital information represented by the signals on the input lines such as the lines 12, 14 and 16 in FIG. 1.

Figure 9:
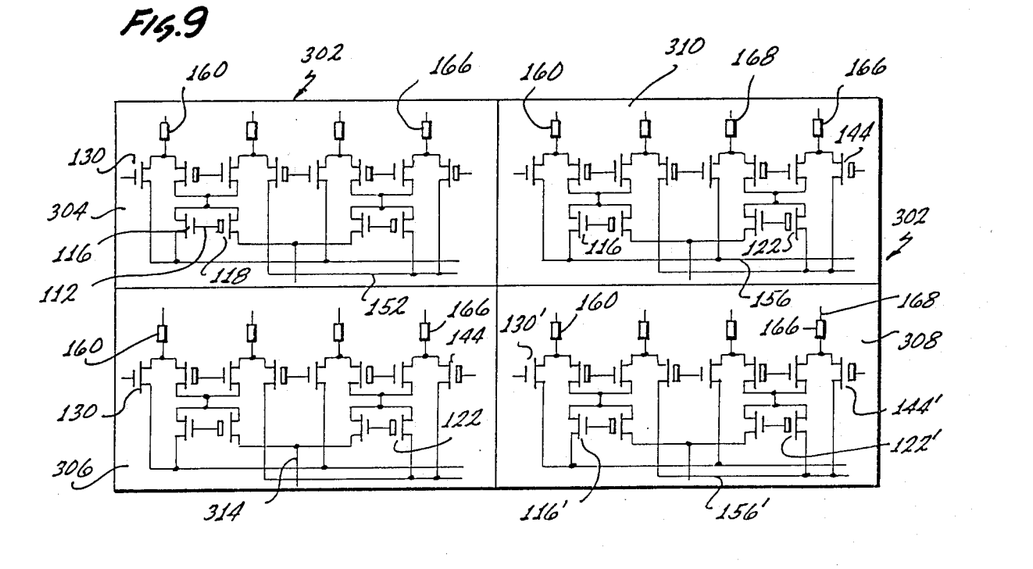
FIG. 9 is a schematic diagram of an integrated circuit chip on which a plurality of converters such as shown in FIG. 3 may be disposed in modular form.

Actually, a plurality of modules may be provided on a single chip generally indicated at 302 in FIG. 9. The modules are indicated schematically at 304, 306, 308 and 310 in FIG. 9. Each of the modules may be constructed in a manner similar to that shown in FIG. 1 or FIG. 3. In this way, an increased number of digits can be provided by combining the modules 304 and 306 to provide a single output from the two modules. For example, the interpolation line from the module 304 may be connected to the module 306 so that the module 304 corresponds to the current divider 200 and the switching network 202 in FIG. 4 and the module 306 corresponds to the current divider 210 and the switching network 212 in FIG. 4. Similar connections may be made to the modules 308 and 310 to increase the number of digits being converted to an analog value.

The provision of a plurality of modules on a single chip also offers other advantages. For example, if tests indicate that the module 308 is defective, the modules 304, 306 and 310 can still be used in combination to provide an enhanced digital significance. This module can be sold to a customer who is interested only in an accuracy represented by three (3) modules rather than four (4). In this way, a defective module does not necessarily mean a destruction of the chip but indicates only that the chip may have to be downgraded in the accuracy of its conversion of digital information to analog information.

In order to increase the accuracy of the output current on the output line 150, the different transistors may be disposed in a spaced relationship such as shown in FIG. 10. For example, the transistors 116, 118, 120 and 122 in FIG. 3 may be considered to indicate the analog value of the binary signal on the input line 112. These transistors may be accordingly disposed at spaced positions on the chip. Similarly, the transistors 130 through 144 (even numbers only) may be considered to indicate in analog form the value of the signal on the line 114. These transistors may accordingly be disposed in spaced relationship on the chip relative to each other and to the transistors 116, 118, 120 and 222.

By disposing in a spaced relationship the transistors representing each binary digit, any deviations in the characteristics of the chip at isolated positions on the chip can be averaged in the transistors of each group so that the accuracy of the output current on the line 150 is enhanced. It will be appreciated that the arrangement shown in FIG. 10 is only by way of example and that the disposition of the transistors may be provided in any suitably spaced relationship to obtain the desired averaging effect.

Figure 11:
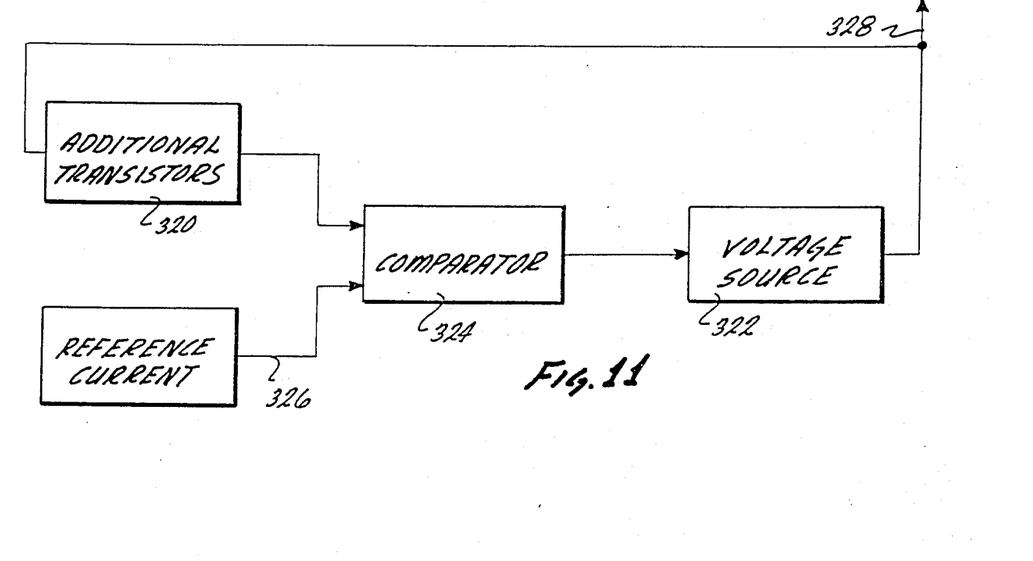
FIG. 11 is a block diagram of apparatus included in the converter of FIG. 3 to regulate the output from the converter.

Additional transistors generally indicated at 320 in FIG. 11 may also be provided on the chip 300 in FIG. 8 or in the modules on the chip 302 in FIG. 9. These additional transistors have characteristics substantially identical to the characteristics of the output transistors in FIG. 3. The additional transistors 320 operate in conjunction with the system shown in FIG. 11 to regulate the current through the output transistors shown in FIG. 3 such as the transistors 160, 162, 164 and 166.

In the system shown in FIG. 11, a current flows through the additional transistors 320 from a voltage source 322 corresponding to the voltage source 170 in FIG. 3. The current flowing through the additional transistors 320 is compared in a comparator 324 with a reference current on a line 326. The output signal from the comparator 324 constitutes an error representing any difference in the comparison. The error signal is introduced to the voltage source 322 to vary the voltage from the source so that the current through the additional transistors 320 becomes equal to the reference current. The adjusted voltage from the source 322 is introduced to the collectors of the output transistors 160 through 166 (even numbers) of FIG. 3 through a line 328 to produce corresponding adjustments in the currents through the output transistors. In this way, the current on the output line 150 in FIG. 3 is adjusted so that it provides a true analog value of the digital representation.

Any number of transistors may be used as the additional transistors 320 and may be disposed on the chip 300 in FIG. 8 or in the modules 304, 306, 308 and 310 on the chip 302 in FIG. 9. The additional transistors may be spaced throughout the chip 300 in FIG. 8 or throughout each of the modules on the chip 302 in FIG. 9 in a manner similar to that described for the transistors in FIG. 3. As will be appreciated, a group of additional transistors 320 may be individually associated with each of the modules 304, 306, 308 and 310. In this way, the currents through the additional transistors 320 are averaged to compensate for deviations in the characteristics of the output transistors in FIG. 3 as a result of localized deviations in the characteristics of the material on the chip 300 in FIG. 8 or the chip 302 in FIG. 9.

The converters shown in FIGS. 1, 3, 4, 5 and 6 and described above convert digital signals to an analog representation. These converters may also be used in a system such as shown in FIG. 12 to provide a conversation of analog information to a plurality of digital signals representing the analog information.

Figure 12:
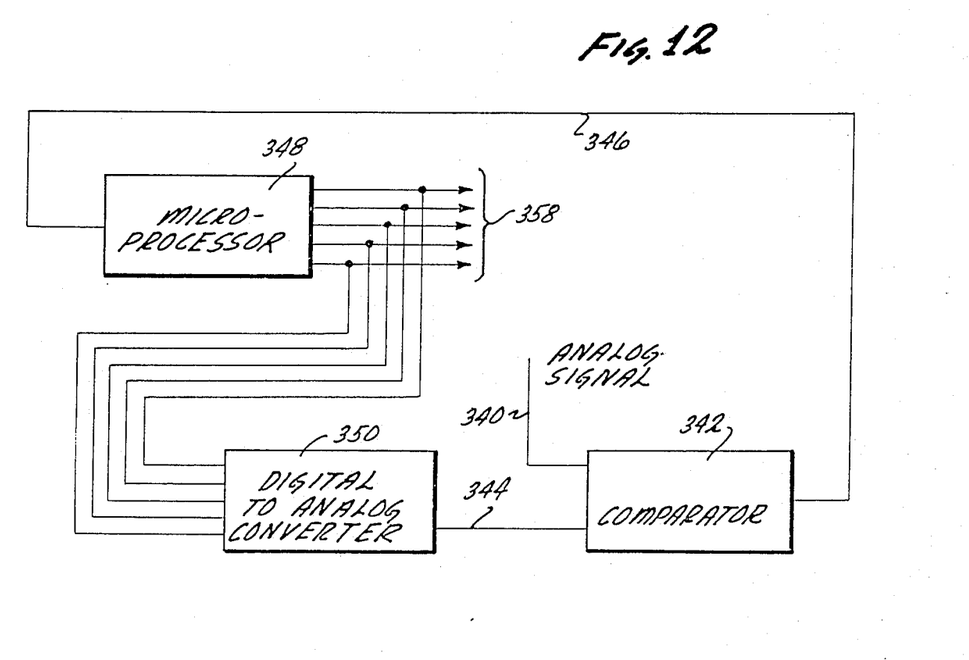
FIG. 12 is a block diagram showing an analog-to-digital converter which incorporates the apparatus of FIG. 3.

In the embodiment shown in FIG. 12, an analog signal is provided on a line 340. This analog signal is to be converted to digital form. This analog signal is compared in a comparator 342 with the analog signal on a line 344 which corresponds to the output line 150 in the coverter shown in FIG. 3. The results of the comparison from the comparator 342 are introduced through a line 346 to a data processor such as a microprocessor 348. The microprocessor 348 processes the information represented by the signal on the line 346 and introduces signals to the input terminals of a digital-to-analog converter 350 corresponding to the converter shown in FIG. 1 or in FIG. 3. The signals introduced to the digital-to-analog converter 350 cause the converter to provide an analog signal on the line 344 corresponding in characteristics to the analog signal on the line 340. When the analog signal on the line 344 corresponds in characteristics to the analog signal on the line 340, the output signals on lines 358 from the microprocessor constitute the digital signals which are introduced to the analog converter of FIGS. 1, 3 or 4 to obtain a conversion into a corresponding analog signal.

The apparatus described above has certain important advantages in addition to the advantages described above. It provides a conversion between digital and analog values at a fast rate because the conversion results from the connection to an output line of output members each constituting a simple current source. The conversion is also accurate because the control of the output signal is obtained by the operation of a plurality of control switches which are connected in a particular matrix arrangement to be instantaneously responsive to the digital signals introduced to the matrix arrangement. The conversion is accurate and reliable, particularly when the converter is disposed on an integrated circuit chip. This results from the fact that the chip is quite small and the chip has substantially uniform characteristics throughout its surface area. For example, the chip may have a surface area less than one tenth inch (1/10") square. Furthermore, the accuracy of the conversion can be enhanced by disposing the control switches in each group in a spaced relationship throughout the surface area of the chip.

The converter of this invention also has other advantages of some importance. For example, the converter is monotonic. This results from the fact that the conversion to analog form of digital signals of progressively increasing value is obtained by connecting an increased number of output members to a particular output line, while maintaining the connection to the particular output line of output members previously connected to the line. Furthermore, by connecting output members to the particular output line to convert digital information to an analog form, errors resulting from differential and integral non-linearities are minimized. This is particularly true when the output members are precision transistors, particularly transistors providing a precision flow of current as in FIG. 5, and when there are a considerable number of output members in the converters. It is also particularly true because the output members are conductive at all times.

The converters of this invention also have other advantages of some importance. For example, they introduce digital signals directly to a particular repetitive array without requiring that the digital signals be modified by decoders as in the prior art. Furthermore, the repetitive array is relatively simple and straightforward and operates to introduce current to an output line with a magnitude directly related to the analog value represented by the digital signals. The particular repetitive array is further advantageous because the paired relationship of the switches in the repetitive array causes substantially the same number of switches in the repetitive array to be closed regardless of the digital value to be converted. Since substantially the same number of switches remains closed, the repetitive array has a balanced operation which contributes to the monoticity and integral and differential linearity of the converters of this invention. The balanced operation is enhanced because all of the output members are continuously conductive whether they be connected to either one of the output lines such as the line 150 or the line 152 in FIG. 3.

There are other important advantages to the converter of this invention. For example, the converter of this invention is quite small. This is particularly true when the converters of this invention are compared with converters which attempt to provide a comparable accuracy in the prior art. The converters of this invention are also quite inexpensive. This results in part from the production of the converter on a single chip.

The converter of this invention also offers the advantage of providing high output currents. This results from the fact that the amount of power delivered at the output line, such as the line 82 in FIG. 1, can be adjusted by varying the number and size of the control switches in each stage in the matrix relationship. For example, the output current can be doubled by doubling the number of switches in each stage. As a result of its ability to supply a large current, the converter of this invention can be considered to provide a current amplification at the same time that it provides a conversion. This is important in such applications as the conversion of aural information such as sound. The invention accordingly has a particular utility in the recently developed techniques of digital recording and reproduction of sound.

The apparatus of this invention is easily adaptable to provide for an addition of digits to increase its accuracy. This results in part from the modular construction of the apparatus such as shown in FIG. 4 and the repetitive nature of the matrix arrangement. The apparatus also maintains its accuracy as it ages. This is particularly true when the apparatus is disposed on a chip such as shown in FIG. 8 or FIG. 9. The apparatus maintains its accuracy as it ages because the chip is essentially homogeneous in construction. As a result, all of the switches on the chip age in substantially identical relationships. The disposition of the different switches in spaced relationship on the chip also facilitates an aging in which the accuracy is maintained.

The converter is also substantially free of the effects of temperature for substantially the same reasons as discussed above with respect to aging. This is particularly true when the current on the output terminal is regulated as shown in FIG. 11 and as discussed above. Such avoidance in the chip of the effects of temperature variations also results from the fact that the distribution of the switches in each group throughout the surface area of the chip prevents the temperature of the chip from becoming excessive at any localized areas.

The converter of this invention also has another advantage of some significance. In the particular repetitive array shown in FIGS. 1 and 3, the width of the switches for each digit can be varied inversely to its numerical significance. For exaple, the switches 24 and 26 in FIG. 1 can be made wider than the switches 30, 32, 34 and 36. This increases the accuracy in the conversion between digital and analog values.

Although this invention has been disclosed and illustrated with reference to particular embodiments, the principles involved are susceptible of numerous other embodiments which will be apparent to persons skilled in the art. The invention is, therefore, to be limited only as indicated by the scope of the appended claims.

I claim:

1. In combination for providing a conversion between a binary coded input word defined by a plurality of bits and an analog value, means for providing a plurality of binary coded input signals each corresponding to a particular bit in the binary coded input word a plurality of switches each responsive only to a particular one of the binary coded input signals, the number of switches responsive to each particular binary coded input signal being dependent upon the binary value of such signal, a plurality of current means each operative to pass a current, a line, means for connecting the switches to one another in an array having a repetitive pattern of switch connections to obtain the operation of the switches in a pattern dependent upon the binary coded input signals, means for connecting the switches, the current means and the line to provide, for progressive increases in the binary coded input word, corresponding increases in the number of the current means passing current to the line in accordance with the pattern of operation of the switches, such pattern causing a particular sequence for passing current from the current means to the line in response to progressive increases in the binary coded input word, that particular sequence being the passage of current from an additional one of the current means to the line with each increase in the value of the binary coded input word while the current means previously passing current to the line continue to pass current to the line.

2. The combination set forth in claim 1 wherein the switches are paired to provide for the operation of only one switch in each pair at each instant and to provide for the selection of the switch in each pair for operation in accordance with the binary coded input signal introduced to such pair of switches and wherein the pattern of operation of the switches in the pairs controls the passage of current from the current means to the line and wherein the connecting means and the pattern of operation of the switches provide at each instant for the passage of current to the line from a number of the current means directly proportional to the analog value.

3. The combination set forth in claim 2 wherein the switches are disposed in the array electrically in sub-sets each having an individual binary value and each including a number of the switches directly proportional to the binary value of such sub-set and wherein the switches are connected in the array to become simultaneously operative in response to the binary coded input signals operative upon such switches.

4. The combination set forth in claim 1 wherein each of the switches is operative at each instant in the array to provide for the passage of a current through only an individual one of the current means dependent upon the binary coded input value at such instant.

5. The combination set forth in claim 1, including, a second line, and means for connecting the switches, the current means and the second line to provide, for progressive decreases in the binary coded input word, corresponding increases in the number of current means passing current to the second line in accordance with the pattern of operation of the switches, such pattern causing a particular sequence for passing current from the current means to the second line in response to progressive decreases in the binary coded input word, the particular sequence being the passage of current from an additional one of the current means to the second line with each decrease in the value of the binary coded input word while the current means previously passing current to the second line continue to pass current to the second line.

6. In combination for providing a conversion between a binary coded input word defined by a plurality of bits and an analog value, means for providing a plurality of binary coded input signals each corresponding to a particular bit in the binary coded input word, a first sub-set of switches, each of the switches in the first sub-set being responsive only to a first individual one of the binary coded input signals, a second sub-set of switches, each of the switches in the second sub-set being responsive only to a second individual one of the binary coded input signals, a third sub-set of switches, each of the switches in the third sub-set being responsive ony to a third individual one of the binary coded input signals, a plurality of output members each operative to provide a current, means connected to the plurality of output members to obtain the flow of current through the output members, the first, second and third individual ones of the signals representing binary bits of progressive binary significance, a line, means for connecting the switches in the first, second and third sub-sets in an array having a repetitive pattern of the switch connections to obtain an operation of the switches in a pattern dependent upon the binary coded input signals, and means for connecting the switches, the output members and the line to provide, for progressive increases in the binary coded input word, corresponding increases in the number of the output members passing current to the line in accordance with the pattern of operation of the switches, such pattern causing a particular sequence for passing current from the output members to the line in response to progressive increases in the binary coded input word, that particular sequence being the passage of current from an additional one of the output members to the line with each increase in the binary coded input word while the output members previously passing current to the line continue to pass current to the line.

7. The combination set forth in claim 6, including,
a second line, and
means for connecting the switches in the first, second and third sub-sets to the output members and the second line to provide, for progressive decreases in the binary coded input word, corresponding increases in the number of the current means passing current to the second line in accordance with the pattern of operation of the switches, such pattern causing a particular sequence for passing current from the current means to the second line in response to progressive decreases in the binary coded input word, that particular sequence being the passage of current from an additional one of the output members to the second line while the output members previously passing current to the second line continue to pass current to the second line.

8. The combination set forth in claim 6, including,
the output members constituting current sources,
each of the switches having first and second states of operation and being operative in one of the first and second states in accordance with the value of the binary coded input signal to which it responds,
the connecting means and the switches in the first, second and third sub-sets defining circuits providing currents through each of the switches in the first state in the first, second and third sub-sets for each different value of the binary coded input word.

9. The combination set forth in claim 7, including,
a third line,
the third line being continuous electrically with the next one of the output members to pass current to the first line for increases in the binary coded input word and to pass current to the second line for decreases in such binary coded input word.

10. The combination set forth in claim 9 wherein
the connecting means for the switches in the first, second and third sub-sets and the switches in the first, second and third sub-sets providing, for each different value of the binary coded input word, for the flow of the same magnitude of current through each of such switches operative in the first state.

11. The combination set forth in claim 9, including,
at least an additional stage,
the additional stage including:
fourth, fifth and sixth sub-sets of switches respectively corresponding to the first, second and third sub-sets of switches,
a second plurality of output members corresponding to the first plurality of output members,
fourth and fifth lines respectively corresponding to the first and second lines,
means for connecting the switches in the fourth, fifth and sixth sub-sets in an array corresponding to the array provided by the connecting means for the switches in the first, second and third sub-sets,
means of introducing to the switches in the fourth, fifth and sixth sub-sets binary coded input signals having a lower value in the binary coded input word than the binary coded input signals introduced to the first, second and third sub-sets,
the first line being connected to the fourth line to provide for the passage of current from individual ones of the second output members to the first line in accordance with the operation of the switches in the second array,
the second line being connected to the fifth line, and
means connected to the first line to provide an indication of the analog value in accordance with the magnitude of the flow of current through the first line.

12. In combination for providing a conversion between a binary coded input word defined by a plurality of bits and an analog value,
means for providing a plurality of binary coded input signals each corresponding to a particular bit in the binary coded input word,
sub-sets of switches, each of the sub-sets of switches being responsive only to an individual one of the binary coded input signals, the number of switches in each sub-set being dependent upon the binary value of the individual one of the binary coded input signals to which to such sub-set responds,
a plurality of output members each operative to pass a current,
means for providing for a flow of current through the output members,
a first line,
means for connecting the sub-sets of control switches in an array having a repetitive pattern of switch connections to obtain the operation of the switches in a pattern dependent upon the binary coded input signal, and
means for connecting the switches, the output members and the line to provide, for progressive increases in the binary coded input word, corresponding increases in the number of the output members passing current to the line in accordance with the pattern of operation of the switches, such pattern causing a particular sequence for passing current from the output members to the line in response to progressive increases in the binary coded input word, that particular sequence being the passage of current from an additional one of the output members to the line with each increase in the binary coded input word while the output members previously passing current to the line continue to pass current to the line
additional means responsive to the binary coded input signals of lower binary value than the value of the binary coded input signals introduced to the sub-sets of the control switches,
an interpolation line responsive to the current at each instant from the next one of the output members to pass current to the first line with each increase in the binary value of the binary coded input signals,
means for connecting the interpolation line and the additional means to provide a current from the interpolation line to the additional means in accordance with the value of the binary coded input signals introduced to the additional means, and
means for connecting the additional means to the first line to obtain through the first line a current having a magnitude representing the analog value.

13. The combination set forth in claim 12, including,
the additional means including additional sub-sets of switches, a second plurality of output members and second connecting means respectively providing the same connections to the switches in the fourth, fifth and sixth sub-sets as the connections of the first connecting means to the switches in the first, second and third sub-sets,
the switches in the first, second, third, fourth, fifth and sixth sub-sets being simultaneously responsive to the individual ones of the binary coded input signals.

14. The combination set forth in claim 12, including, a third line, and
means for connecting the switches, the current means and the third line to provide, for progressive decreases in the binary coded input word, corresponding increases in the number of the output members passing current to the third line in accordance with the pattern of operation of the switches, such pattern causing a particular sequence for passing current from the output members to the third line in response to progressive decreases in the binary coded input word, that particular sequence being the passage of current from an additional one of the output means to the third line with each increase in the value of the binary coded input word while the current means previously passing current to the third line continue to pass current to the third line.

15. The combination set forth in claim 12, including, each of the switches being connected in the repetitive array to pass the same magnitude of current through each of the switches, regardless of the value of the binary coded input word, when the switches are operative to pass current.

16. The combination set forth in claim 15, including, the switches in each sub-set being paired to provide for an operation of only one of the switches in each pair in response to the individual one of the binary coded input signals to which the switches respond.

17. In combination for use with binary coded input signals for converting a binary coded input word defined by bits into an analog value, each of the binary coded input signals corresponding to a particular bit in the binary coded input word,
a first pair of switches each responsive only to one of the binary coded input signals of low value, each of the control switches in the first pair having first, second and third terminals,
second and third pairs of switches each responsive only to the binary coded input signal of next highest binary value, each of the switches in the second and third pairs having first, second and third terminals respectively corresponding to the first, second and third terminals in the control switches of the first pair,
the first terminals in the switches of the first pair being connected to the second terminals of a particular one of the control switches in each of the second and third pairs,
first and second lines,
the second terminal of the other switch in the second pair being connected to the first line,
the second terminal of the control switch in the third pair being connected to the second line,
means for introducing the binary coded input signal of the low value to the third terminals of the switches in the first pair to obtain an operation of the switches in the first pair only in accordance with such low value, and
means for introducing the binary coded input signal of the next highest binary value to the third terminals of the switches in the second and third pairs to obtain an operation of such switches in the second and third pairs only in accordance with such next highest value.

18. The combination set forth in claim 17, including, each of the switches in each of the first, second and third pairs having first and second states of operation,
the switches in the first pair being constructed to provide for an operation one of the switches in the first state and the other of the switches in the second state only in accordance with the binary coded input signal to which such switches respond,
the switches in the second and third pairs being constructed to provide for an operation of one of the switches in each pair in the first state and an operation of the other switch in each pair in the second state only in accordance with the binary coded input signal to which such switches respond.

19. The combination set forth in claim 18, including, an interpolation line,
the second terminal of one of the switches in the first pair being connected to the first line and the second terminal of the other one of the switches in the first pair being connected to the interpolation line.

20. The combination set forth in claim 18, including, a plurality of output members, each of the output members being operative to pass a current,
the first terminals of the switches in the second pair being coupled to a first one of the output members and the first terminals of the switches in the third pair being coupled to a second one of the output members, and
means coupled to the output members to produce a flow of current through each of the output members and through the switches in the first state in the first, second and third pairs to individual ones of the first and second lines and the interpolation line dependent upon the patterns of operation of the switches in the first, second and third pairs in the first and second states.

21. In combination for converting between a binary coded input word defined by a plurality of bits and an analog value,
means for providing a plurality of binary coded input signals each corresponding to a particular bit in the binary coded input word,
a plurality of switches each responsive only to an individual one of the binary coded input signals,
means for connecting the switches in an array having a repetitive pattern of switch connections to obtain the operation of the switches in a pattern dependent upon the binary coded input signals,
first and second sub-sets of the switches, each of the switches in the first and second sub-sets having first, second and third terminals,
the first terminals of the switches in the first sub-set being connected to the second terminals of first switches in the second sub-set and to the third terminals of second switches in the second sub-set,
the switches in the second sub-set having the next highest binary value to the switches in the first sub-set,
first and second lines,
the third terminals of the switches in the second sub-set being connected to the first line, and
the second terminals of the switches in the second sub-set being connected to the second line.

22. The combination set forth in claim 21, including, a third line,
the second terminals of the switches in the first sub-set being connected to the third line,
a plurality of output members, each of the first terminals of the switches in the second sub-set being connected to an individual one of the output members.

23. The combination set in claim 21, including,
a third line,
means for providing for a flow of current through the third line and a particular one of the output members, the particular one of the output members being the next to pass current to the first line for increases in the binary coded input word and to pass current to the second line for decreases in such binary coded input word.

24. In combination for converting between a binary coded input word defined by a plurality of bits and an analog value,
means for providing a plurality of binary coded input signals each corresponding to a particular bit in the binary coded input word,
a plurality of switches connected in an array defined by sub-sets, the switches in each sub-set being responsive only to a particular one of the binary coded input signals, the number of the switches in each sub-set being dependent upon the binary value of the binary coded input signal to which the switches in the sub-set respond,
the array being defined by repetitions of a particular sub-relationship, each such repetition being defined by a particular number of the switches in one of the sub-sets of a first binary value and a different number of the switches in the sub-set of the next highest binary value, such different number being dependent upon the next highest binary value relative to the first binary value, and each such repetition being further defined by a particular pattern of interconnections between the switches of the first binary value and the switches of the next highest binary value,
a plurality of current means each operative to pass an electrical current,
a line, and
means for connecting the switches, the current means and the line to provide, for progressive increases in the binary binary coded input word, corresponding increases in the number of the current means passing current to the line in accordance with the pattern of the operation of the switches, such pattern causing a particular sequence for passing current from the current means to the line in response to progressive increases in the binary coded input word, that particular sequence being the passage of current from an additional one of the current means to the line while the current means previously passing current to the line continue to pass current to the line.

25. The combination set forth in claim 24 including:
each of the switches is connected in the repetitive array to pass a current through only one of the current means regardless of the value of the binary coded input word.

26. The combination set forth in claim 24 including:
a second line, and
means for connecting the switches, the current means and the second line to provide, for progressive decreases in the binary coded input word, corresponding increases in the number of the current means passing current to the second line in accordance with the pattern of operation of the switches, such pattern causing a particular sequence for passing current from the current means to the second line in response to particular decreases in the binary coded input word, the particular sequence being the passage of current from an additional one of the current means to the second line while the current means previously passing current to the second line continue to pass current to the second line.

27. The combination set forth in claim 26, including,
a third line, and
means for connecting the switches, the current means and the third line to provide for the passage of current through a particular one of the output members to the third line, the particular one of the output members being the next one to pass current to the first line for a progressive increase in the binary coded input word and to pass current to the second line for a progressive decrease in the binary coded input word.

28. In a combination as set forth in claim 6,
the switches in each of the first, second and third sub-sets being paired and having first and second states of operation, the switches in each pair in each of the first, second and third sub-sets providing for an operation of only one of the switches in each pair in the first state in response to the binary coded input signal.

29. The combination set forth in claim 24, including,
each sub-set having twice as great a binary value as the sub-set of the next least binary value and having twice as great a number of switches as the number of the switches in the sub-set of the next least binary value.

30. The combination set forth in claim 21 wherein
the number of the switches in the second sub-set is twice as great as the number of the switches in the first sub-set and the binary value of the second sub-set is twice as great as the binary value of the first sub-set.

31. The combination as set forth in claim 24 wherein
each of the switches is connected in the repetitive array to pass the same magnitude of current to the line as the magnitude of the current through the other switches in the array.

* * * * *